United States Patent
Lee

(10) Patent No.: US 7,005,891 B2
(45) Date of Patent: Feb. 28, 2006

(54) DATA TRANSMISSION CIRCUIT FOR UNIVERSAL SERIAL BUS SYSTEM

(75) Inventor: Jae-Jum Lee, Sungnam-shi (KR)

(73) Assignee: Samsung Electronics Co., Ltd., (KR)

( * ) Notice: Subject to any disclaimer, the term of this patent is extended or adjusted under 35 U.S.C. 154(b) by 859 days.

(21) Appl. No.: 10/113,375

(22) Filed: Mar. 29, 2002

(65) Prior Publication Data

US 2002/0191707 A1 Dec. 19, 2002

(30) Foreign Application Priority Data

Jun. 16, 2001 (KR) ................. 2001-34184

(51) Int. Cl.
H03K 19/94 (2006.01)

(52) U.S. Cl. .................... 326/86; 326/82; 326/83; 326/26

(58) Field of Classification Search ........... 326/26–27, 326/82–83, 86, 90; 327/108–112

See application file for complete search history.

(56) References Cited

U.S. PATENT DOCUMENTS

| 5,424,657 | A | 6/1995 | Van Brunt et al. ............ 326/63 |
| 5,726,588 | A | 3/1998 | Fiedler ........................ 326/63 |
| 5,912,569 | A | 6/1999 | Alleven ...................... 327/108 |
| 5,940,448 | A * | 8/1999 | Kuo ........................... 375/316 |
| 6,172,542 | B1 | 1/2001 | Williams et al. ............ 327/239 |
| 6,237,107 | B1 | 5/2001 | Williams et al. ............ 713/503 |
| 6,615,301 | B1 * | 9/2003 | Lee et al. .................... 710/106 |
| 6,700,408 | B1 | 3/2004 | Lee ............................. 326/86 |

FOREIGN PATENT DOCUMENTS

| JP | 10-303715 | 11/1998 |
| KR | 10-2001-26926 | 4/2001 |
| KR | 2001-27765 | 4/2001 |
| WO | WO 99/48260 A1 | 9/1999 |

* cited by examiner

Primary Examiner—Anh Q. Tran
(74) Attorney, Agent, or Firm—Mills & Onello LLP

(57) ABSTRACT

The data transmission circuit generates the first and second data signals that are transferred respectively to first and second data lines after delaying or expanding a rising edge or a falling edge of an externally supplied data input signal, so that a crossover voltage of the data signals is established in accordance with the USB standard V1.1.

20 Claims, 9 Drawing Sheets

DATA TRANSMISSION CIRCUIT FOR UNIVERSAL SERIAL BUS SYSTEM This application relies for priority upon Korean Patent Application No. 2001-34184, filed on Jun. 16, 2001, the contents of which are herein incorporated by reference in their entirety.

FIELD OF THE INVENTION

The present invention generally relates to universal serial bus systems and, more specifically, to data transmission circuits having low-speed output drivers enhancing crossover characteristics in the universal serial bus systems.

BACKGROUND OF THE INVENTION

In accordance with the latest functional developments in computer processors and application programs, it has become necessary to efficiently expand the connection capacity of computers for various kinds of peripheral devices. Conventional external ports of computer systems have already come up to limits of the peripheral devices with various functions and interface forms. For those demands, a new bus interface system, referred to as the "universal serial bus" (hereinafter, referred to as "USB"), has been developed by major computer and telephone networks companies, such as Intel, Microsoft, Compaq, NEC, and so on, in order to provide practical applications adaptable to various interfacing needs. The USB now has become a new standard for interfacing between computers and peripheral devices. The USB standard V1.0 was first defined on Jan. 15, 1996, and was revised to USB V1.1 on Jul. 28, 1998.

The USB device can be assigned to a multiplicity of peripheral devices numbering, for example, 127. One peripheral device includes 16 end points. Therefore, it is possible to grant 16 functions at maximum in one peripheral device. There are various peripheral devices connectable to USB devices, such as telephones, MODEMs, printers, scanners, game pads, microphones, digital speakers, styluses, joysticks, mice, monitors, or digital cameras.

Interface cables connecting a host computer to a peripheral device, or connecting between peripheral devices, are composed of a power source voltage (VDD) line, a ground voltage line (VSS), and a pair of data signal lines (D+, D−). The data signals must be leveled in the CMOS voltage range of 3.3V as an example.

The USB V1.1 also defines optional speed modes of full-speed (or high-speed) and low-speed. The high-speed mode is operable at 12 Mbps (mega bits per second) while the low-speed mode is 1.4 Mbps. In the low-speed mode, since bus occupation rate can be eight times that in the high-speed mode, data transmission conditions are negatively affected for high frequency devices when too many devices are connected thereto or short cycles are dominant in processing data. Therefore, the low-speed mode is adaptable to devices in need of low cost and low power consumption, or to devices with smaller amounts to data transmission, such as a mouse or a keyboard.

The pair of data signals (D+, D−) is a complementary pair in which one is a high level when the other is a low level. The data signal is designed to rise up to a high level or to fall down to a low level, with a predetermined slope. According to the USB standard, a crossover voltage, i.e., a voltage point where one data signal slope rising to a high level from a low level meets the other data signal slope falling to a low level from a high level, should be within the range between 1.3V and 2.0V.

Transmission data in the form of NRZI (Non-Return-to-Zero-Invert) are converted into bus-specific data signals (D+, D−) modulated by a transceiver to be adaptable to USB cables. A crossover voltage of the bus-specific data signals is sensitive to threshold voltages of transistors constructed in the transceiver. For instance, assuming that a distribution profile of threshold voltages is 0.9V±0.1V, the threshold voltages ranges from 0.8V at minimum to 1.0V at maximum. As a result, there occur differences between a rising time and a falling time, which causes variation of crossover voltage of the bus-specific data signals. If there is a jitter of time difference due to a difference between transition speeds of the data signals at a USB transmission stage, it is hard to obtain correct data at a USB receiving stage.

SUMMARY OF THE INVENTION

It is, therefore, an object of the present invention to provide a low-speed output driver capable of enhancing a crossover characteristic of data signals in a universal serial bus system.

It is another object of the present invention to provide a low-speed output driver reliably operable in a universal serial bus system, without being affected by variations in manufacturing processes.

The data transmission circuit generates the first and second data signals which are transferred to the first and second data lines, respectively, after delaying or expanding a rising edge or a falling edge of an externally supplied data input signal. As a result, a crossover voltage of the data signals is established in accordance with the USB standard V1.1.

According to one aspect of the invention, a data transmission circuit for transferring first and second data signals into third and fourth data signals, respectively, includes: a first means for generating first and second drive signals by delaying an alternative one of rising and falling edges of a data input signal in response to plural control signals; a second means for generating the third data signal in response to the first and second drive signals; a third means for generating third and fourth drive signals by delaying an alternative one of rising and falling edges of the data input signal in response to the control signals; and a fourth means for generating the fourth data signal in response to the third and fourth drive signals.

In one embodiment, the first means comprises: a first pulse-width control circuit for delaying an alternative one of the rising and falling edges of the data input signal in response to the first delay time selection signal and the first pulse-width control selection signal; and a first drive signal generator for creating the first and second drive signals in response to the output enable signal, the first drive signal being active when an output signal from the first pulse-width control circuit, the output enable signal, and the second drive signal are all activated, the second drive signal delayed by a predetermined time from the output signal of the first pulse-width control circuit.

In one embodiment, the second means comprises: a first delay circuit for delaying the first drive signal for a predetermined time; a first circuit for receiving an output signal of the first delay circuit, having input and output terminals; a second circuit for receiving an output signal of the first delay circuit, having input and output terminals; a first transistor, of a first conductivity, connected between a power supply voltage and the first data line, a gate of the first transistor being coupled to the output terminal of the first circuit; a second transistor, of a second conductivity, connected between the power supply voltage and the first data line, a gate of the second transistor being coupled to the output terminal of the second circuit; a second delay circuit for delaying the second drive signal for a predetermined time; a third circuit for receiving an output signal of the second delay circuit, having input and output terminals; a fourth circuit for receiving an output signal of the second delay circuit, having input and output terminals; a third transistor, of the first conductivity, connected between the first data line and a ground voltage, a gate of the third transistor being coupled to the output terminal of the third circuit; a fourth transistor, of the second conductivity, connected between the first data line and the ground voltage, a gate of the fourth transistor being coupled to the output terminal of the fourth circuit; and a capacitor coupled between the first data line and the ground voltage.

In one embodiment, the third means comprises: a second pulse-width control circuit for delaying an alternative one of the rising and falling edges of the data input signal in response to the first delay time selection signal and the second pulse-width control selection signal; and a second drive signal generator for creating the third and fourth drive signals in response to the output enable signal, the third drive signal being active when an output signal from the second pulse-width control circuit, the output enable signal, and the fourth drive signal are all activated, the fourth drive signal delayed by a predetermined time from the output signal of the second pulse-width control circuit.

In one embodiment, the fourth means comprises: a first delay circuit for delaying the third drive signal for a predetermined time; a first circuit for receiving an output signal of the first delay circuit, having input and output terminals; a second circuit for receiving an output signal of the first delay circuit, having input and output terminals; a first transistor, of a first conductivity, connected between a power supply voltage and the second data line, a gate of the first transistor being coupled to the output terminal of the first circuit; a second transistor, of a second conductivity, connected between the power supply voltage and the second data line, a gate of the second transistor being coupled to the output terminal of the second circuit; a second delay circuit for delaying the fourth drive signal for a predetermined time; a third circuit for receiving an output signal of the second delay circuit, having input and output terminals; a fourth circuit for receiving an output signal of the second delay circuit, having input and output terminals; a third transistor, of the first conductivity, connected between the second data line and a ground voltage, a gate of the third transistor being coupled to the output terminal of the third circuit; a fourth transistor, of the second conductivity, connected between the second data line and the ground voltage, a gate of the fourth transistor being coupled to the output terminal of the fourth circuit; and a capacitor coupled between the second data line and the ground voltage.

BRIEF DESCRIPTION OF THE DRAWINGS

The foregoing and other objects, features and advantages of the invention will be apparent from the more particular description of a preferred embodiment of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENT

Figure 1:
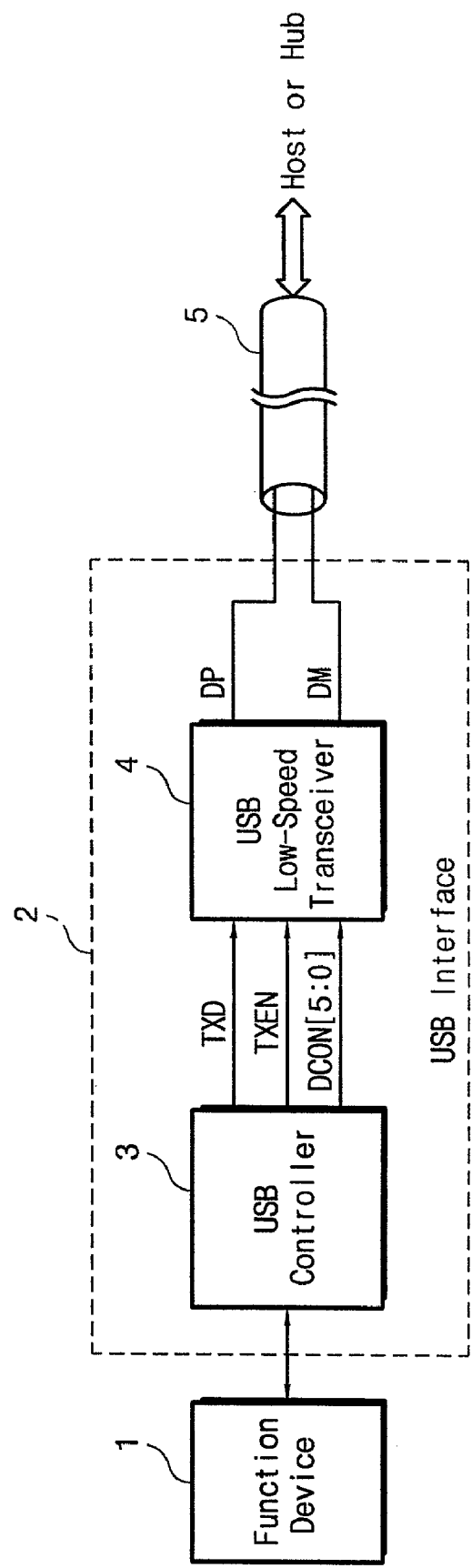
FIG. 1 schematically illustrates a structure of a low-speed USB device according to a preferred embodiment of the invention.

FIG. 1 shows a configuration of a USB interface system 2 connected between a function device 1 and a USB cable 5. The USB interface system 2 connects the function device 1 to a USB host or a hub through a USB cable. The USB interface system 2 includes a USB controller 3 and a low-speed USB transceiver 4. The USB controller 3 applies transmission data TXD, a transmission enable signal TXEN activating a data transmission, and control signals DCON [5:0] to the transceiver 4. The transmission data TXD generated from the USB controller 2 are formed in the encoded fashion of NRZI (Non-Return-to-Zero-Invert) in accordance with USB protocol. The transceiver 4 acts as a transmission output buffer associated with a pair of data lines which are connected to the host of the hub through the USB cable 5.

The USB interface system 2 presented by the invention is usefully applicable in performing interface operations between digital data processing systems, such as personal computers or serial data buses (e.g., USB) of work stations, and function devices providing various kinds of additional functions to the systems, such as keyboards, mice, joysticks, microphones, and speakers. It uses USBs or FWs for serial buses connecting peripheral devices to personal computers or workstations. Here, the invention is applied to be cooperative with other types of interface systems while this embodiment is employed in a USB environment.

The USB transmits signals and power voltages through a four-wire cable. Two wire point-to-point segments carry out the signaling. Signals at each segment are sequentially driven by a cable having intrinsic impedance defined in the USB standard manual V1.1. The USB assists a tri-state operation for bi-directional half duplex mode and has the maximum transmission speed of 12 Mbps.

There are two kinds of operation modes in the USB signaling, i.e., a full-speed (or high-speed) mode with the data rate of 12 Mbps±0.25% and a low-speed mode with the data rate of 1.5 Mbps±1.5%. The two modes are alternatively operable in a single USB system by using a mode switching function. A USB for the low-speed mode is connected through an unshielded and untwisted pair cable having the maximum length of 3 m. In the low-speed mode, a rising time or a falling time of signals on the cable is longer than 75 ns so as to restrain RFI emissions and shorter than 300 ns so as to regulate timing delays and signaling skews and distortions. And, a low-speed driver provides specific static signal levels having smooth rising and falling slopes.

The USB function devices are classified into two kinds in view of power supply scheme: one is a self-powered device having a power supply unit for itself; the other is a bus-powered device receiving a power of 5V through a cable. Signals are operable in the voltage range of 0~5V in each device while data signals transmitted between each device and the USB cable are operable in the voltage range of −0.5~3.8V. Thus, a power voltage of 3.3V must be supplied at least to each device in order to conduct operations with data signals.

Figure 2:
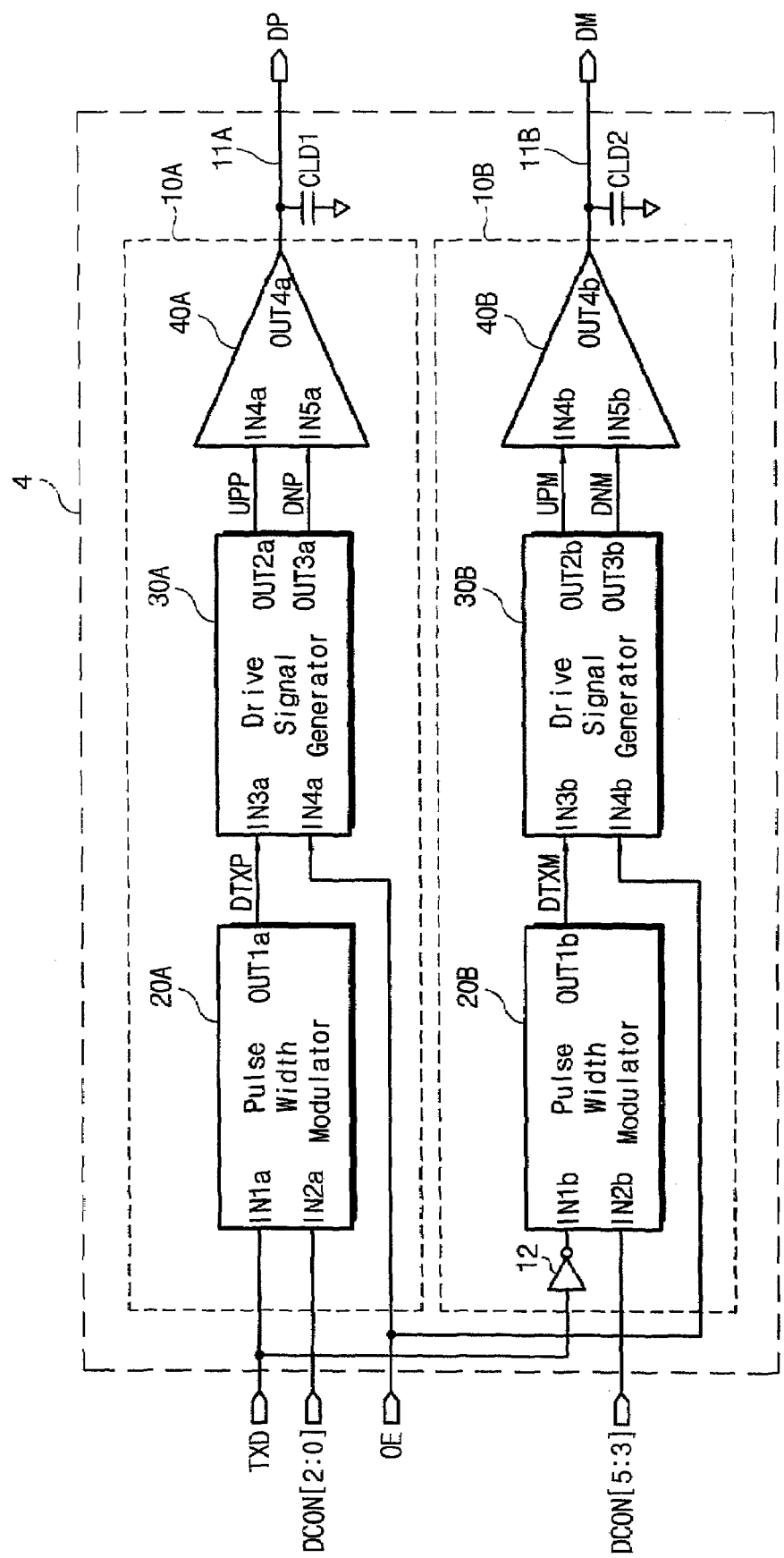
FIG. 2 schematically illustrates a detail structure of a low-speed USB transceiver shown in FIG. 1.

FIG. 2 shows a configuration of the USB low-speed transceiver 4 shown in FIG. 1. Referring to FIG. 2, the transceiver 4 is formed of the first and second output drivers, 10A and 10B, a load capacitor CLD1 coupled between a data line (the first data line) 11A and a ground voltage, a load capacitor CLD2 coupled between a data line (the second data line) 11B and the ground voltage. The first output driver 10A is composed of a pulse width modulator 20A, a drive signal generator 30A, and an output buffer 40A, and the second output driver 10B is composed of a pulse width modulator 20B, a drive signal generator 30B, and an output buffer 40B. The first output driver 10A receives the transmission data signal TXD (e.g., a signal operable in the voltage range of 0~5V) from the USB controller 3, and then generates the first bus-specific data signal DP, which is converted from the data signal TXD into one of bus specific form, through the first data line 11A. The second output driver 10B receives the transmission data signal TXD (e.g., a signal operable in the voltage range of 0~5V) from the USB controller 3, and then generates the second bus-specific data signal DM (complementary to DP), which is converted from the data signal TXD into one of bus specific form, through the first data line 11B. The pulse width modulators 20A and 20B are formed of the same configuration, as are the drive signal generators 30A and 30B and the output buffers 40A and 40B.

The pulse width modulator 20A has an input terminal IN1a receiving the transmission data signal TXD, another input terminal IN2a receiving the control signals DCON[2:0], and an output terminal OUT1a. The pulse width modulator 20B is comprised of an inverter 12 receiving the transmission data signal TXD, an input terminal IN1b receiving the inverted transmission data signal TXD, another input terminal IN2b receiving the control signals DCON[5:3], and an output terminal OUT1b.

The drive signal generator 30A has an input terminal IN3a connected to the output terminal OUT1a, another input terminal IN4a connected to the output enable signal OE, and output terminals OUT2a and OUT3a. The drive signal generator 30B has an input terminal IN3b connected to the output terminal OUT1b, another input terminal IN4b connected to the output enable signal OE, and output terminals OUT2b and OUT3b.

The output buffer 40A has input terminals IN4a and IN5a connected to the output terminals OUT2a and OUT3a, respectively, and an output terminal OUT4a. The output buffer 40B has input terminals IN4b and IN5b connected to the output terminals OUT2b and OUT3b, respectively, and an output terminal OUT4b.

Figure 3:
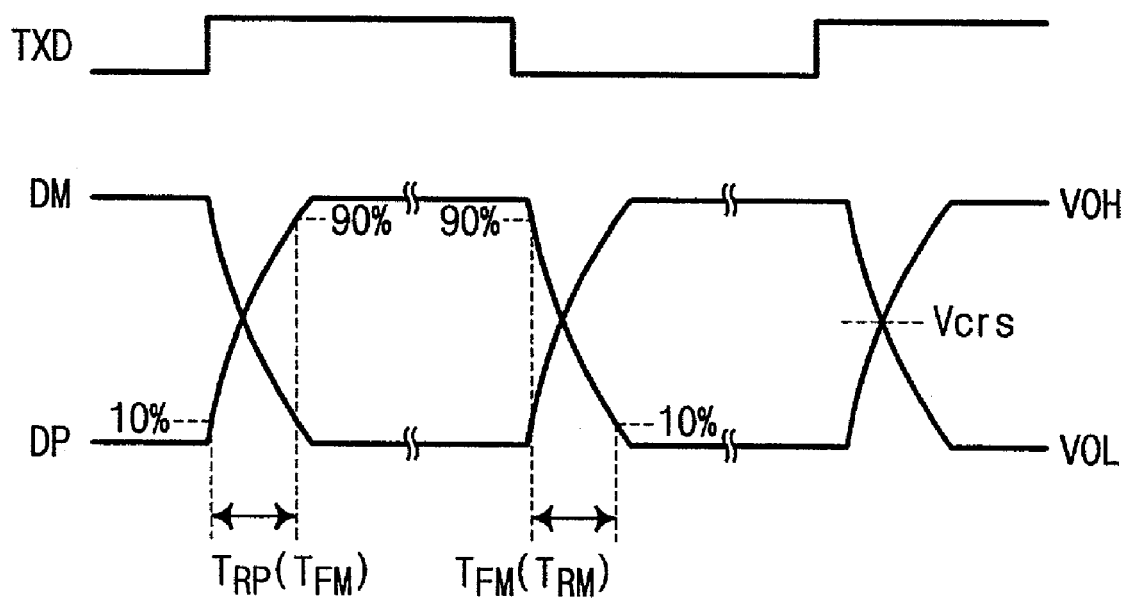
FIG. 3 is a timing diagram illustrating bus-specific data signals generated from the low-speed USB transceiver and a transmission data signal applied to the low-speed USB transceiver.

FIG. 3 shows waveforms of the transmission data signal TXD applied to the USB low-speed transceiver 4 and the bus-specific data signals DP and DM generated from the transceiver 4. Referring to FIGS. 2 and 3, a crossover voltage $V_{CRS}$ where the bus-specific data signals DP and DM meet each other is controllable by means of the pulse width modulators 20A and 20B. Rising and falling times of the first bus-specific data signal DP, $T_{RP}$ and $T_{FP}$, respectively, are established by the output buffer 40A while rising and falling times of the second bus-specific data signal DM, $T_{RM}$ and $T_{FM}$, respectively, are established by the output buffer 40B. Procedures to set the rising and falling times of the data signals in the output buffers are described hereinbelow.

Figure 4:
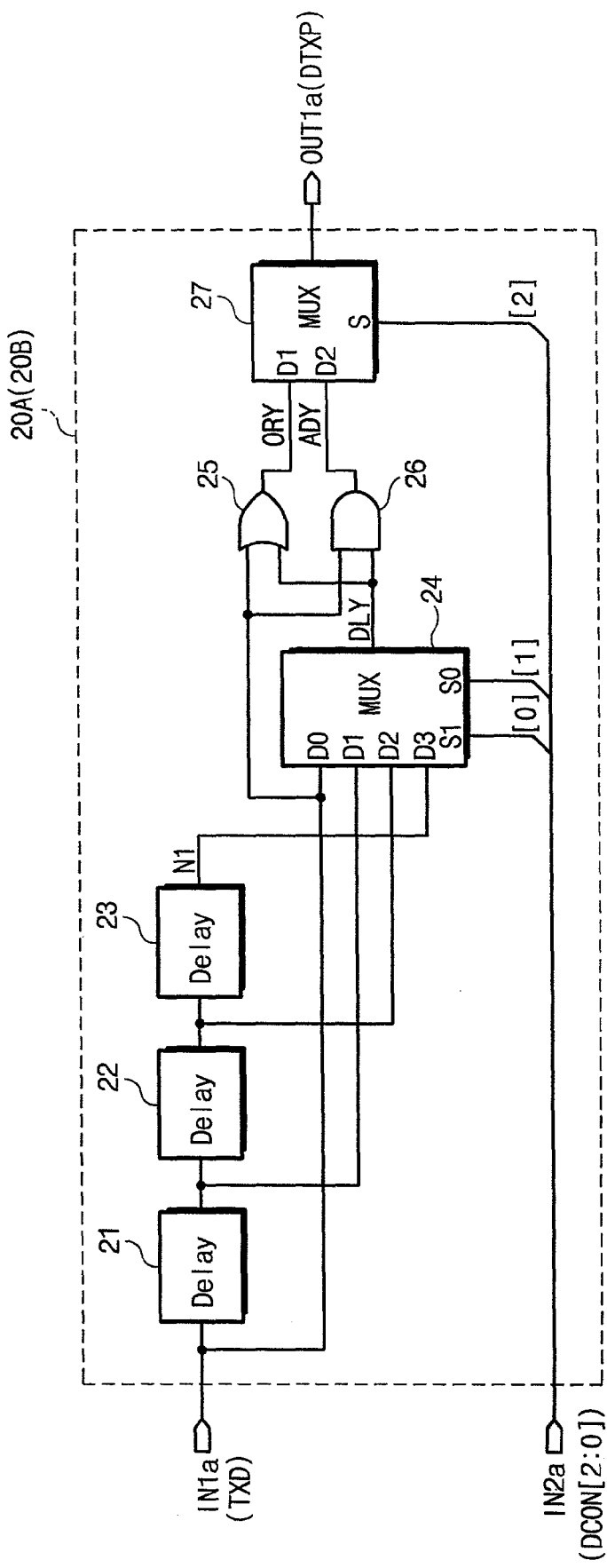
FIG. 4 illustrates a detail structure of a pulse width modulator shown in FIG. 2.
Figure 5:
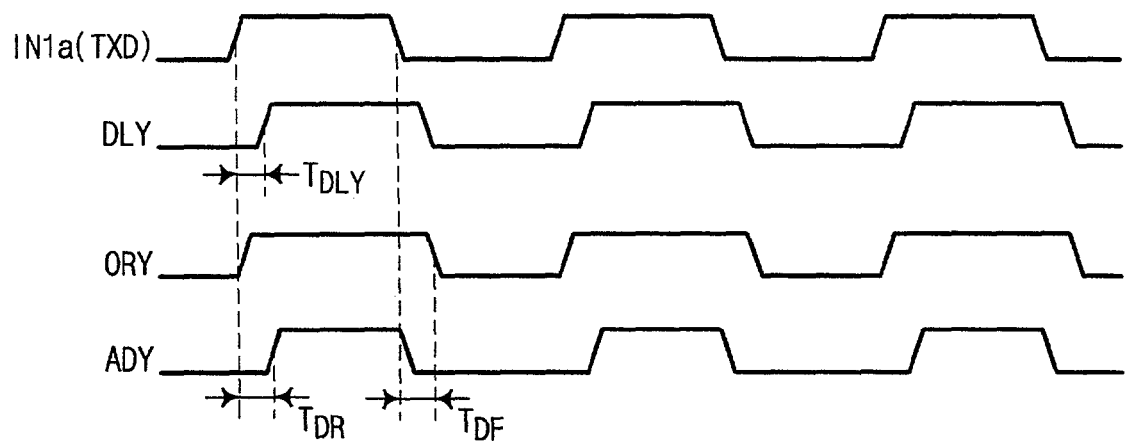
FIG. 5 is a timing diagram illustrating signals conductive in the pulse width modulator shown in FIG. 4.

FIGS. 4 and 5 show a configuration and signals of the pulse width modulator 20A. Referring to FIG. 4, the pulse width modulator 20A (20B has the same configuration as 20A) is composed of delay circuits 21, 22, and 23, multi-plexers 24 and 27, an OR gate 25, and an AND gate 26.

The delay circuits 21~23 are connected in series between the input terminal IN1a and a node N1. The input terminal IN1a and output terminals of the delay circuits 21~23 are connected to input terminals D0~D3, respectively, of the multiplexer 24. The multiplexer 24 outputs one delay signal DLY selected among input signals applied to the input terminals D0~D3 in response to the control signals DCON[1:0] supplied through the input terminal IN2a. That is, a time difference TDLY between the input signal at IN1a and the delay signal DLY from the multiplexer 24, shown in FIG. 5, is determined by the control signals DCON[1:0] provided through the input terminal IN2a.

The OR gate 25 carries out an OR logic operation with the input signal at IN1a and the delay signal DLY from the multiplexer 24. The AND gate 26 carries out an AND logic operation with the input signal at IN1a and the delay signal DLY from the multiplexer 24.

As shown in FIG. 5, a signal ORY generated from the OR gate 25 has a falling edge later than the input signal at IN1a by $T_{DR}$ while a signal ADY generated from the AND gate 26 has a rising edge later than the input signal at IN1a by $T_{DF}$.

Next, the multiplexer 27 transfers an alternative one of the signals ORY and ADY into the output terminal OUT1a as an output signal DTXP in response to the control signal DCON[2] supplied through the input terminal IN2a (DCON[5] in the pulse width modulator 20B).

As stated above, the pulse width modulators 20A and 20B adjust the rising and falling times of the transmission data signals (including complementary transmission data signal), so that the crossover voltage VCRS of the bus-specific data signals, DP and DM, is regulated within a desirable range.

Figure 6:
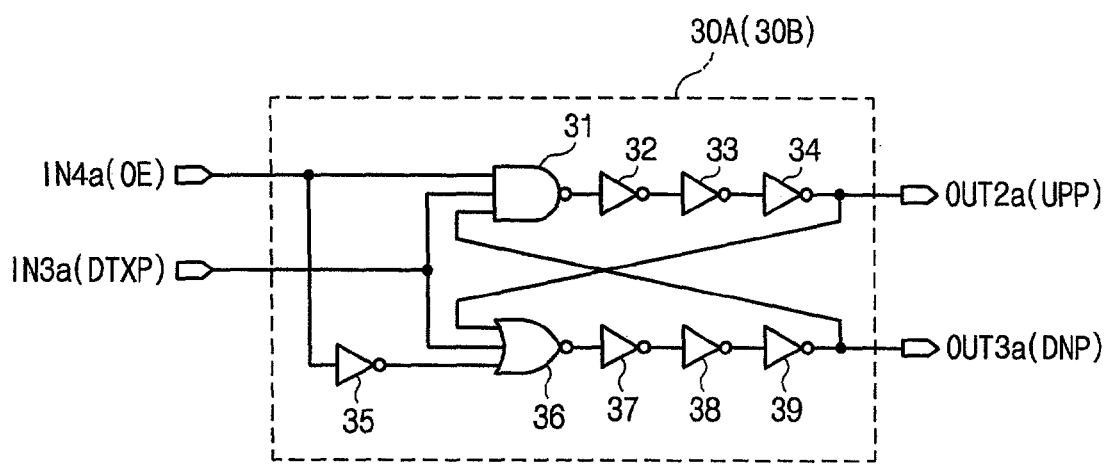
FIG. 6 illustrates a detail structure of a drive signal generator shown in FIG. 2.
Figure 7:
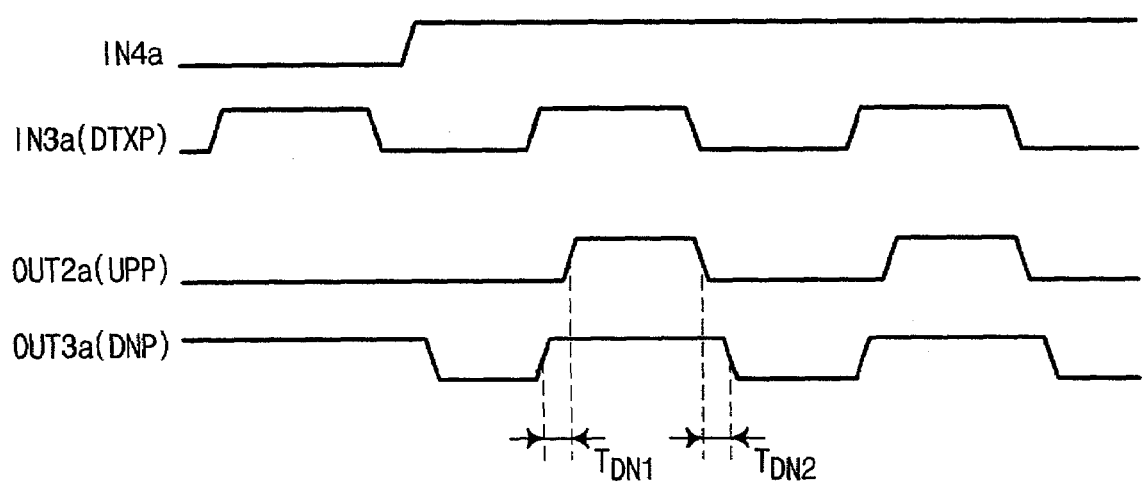
FIG. 7 is a timing diagram of signals conductive in the drive signal generator shown in FIG. 5.

FIGS. 6 and 7 show a configuration and signals of the drive signal generator. Referring to FIG. 6, the drive signal generator 30A (30B is the same as 30A) is composed of a NAND gate 31, a NOR gate 36, and inverters 32 through 35 and 37 through 39. The NAND gate 31 carries out a NAND logic operation with the output enable signal OE supplied through the input terminal IN4a, the signal DTXP (DTXM in 30B) supplied through the input terminal IN3a, and the second drive signal DNP (DNM in 30B) fed back from the output terminal OUT3a. The inverters 32~34 are connected in series between an output node of the NAND gate 31 and the output terminal OUT2a. The first drive signal DPP (DPM in 30B) is a signal logically reversed to and delayed by a predetermined time from an output of the NAND gate 31.

The inverter 35 reverses a logic state of the output enable signal OE that is supplied through the input terminal IN4a. The NOR gate 36 carries out a NOR logic operation with the inverted signal of the output enable signal OE, the signal DTXP (DTXM in 30B) supplied through the input terminal IN3a, and the first drive signal UPP (UPM in 30B) fed back from the output terminal OUT2a. The inverters 37~39 are connected in series between an output node of the NOR gate 36 and the output terminal OUT3a. The second drive signal DNP (DNM in 30B) at the output terminal OUT3a is a signal logically reversed to and delayed by a predetermined time from an output of the NOR gate 36.

In FIG. 7, non-overlapped portions TDN1 and TDN2 between the first and second drive signals UPP and DNP contribute to reduce the amount of passing-through current in the output buffer 40A described below in detail.

Figure 8A:
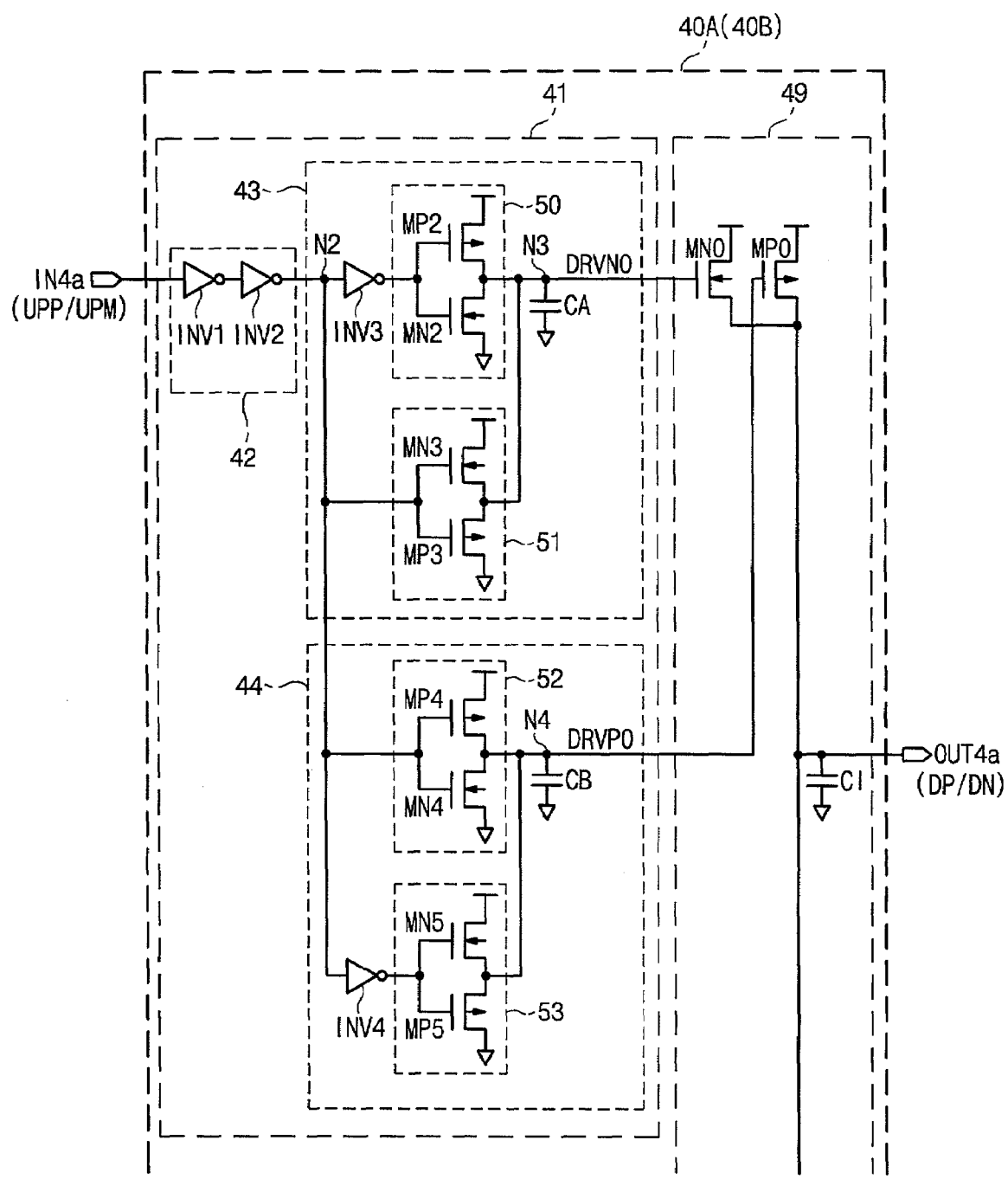
FIGS. 8A and 8B illustrates a detail structure of an output buffer shown in FIG. 2.
Figure 8B:
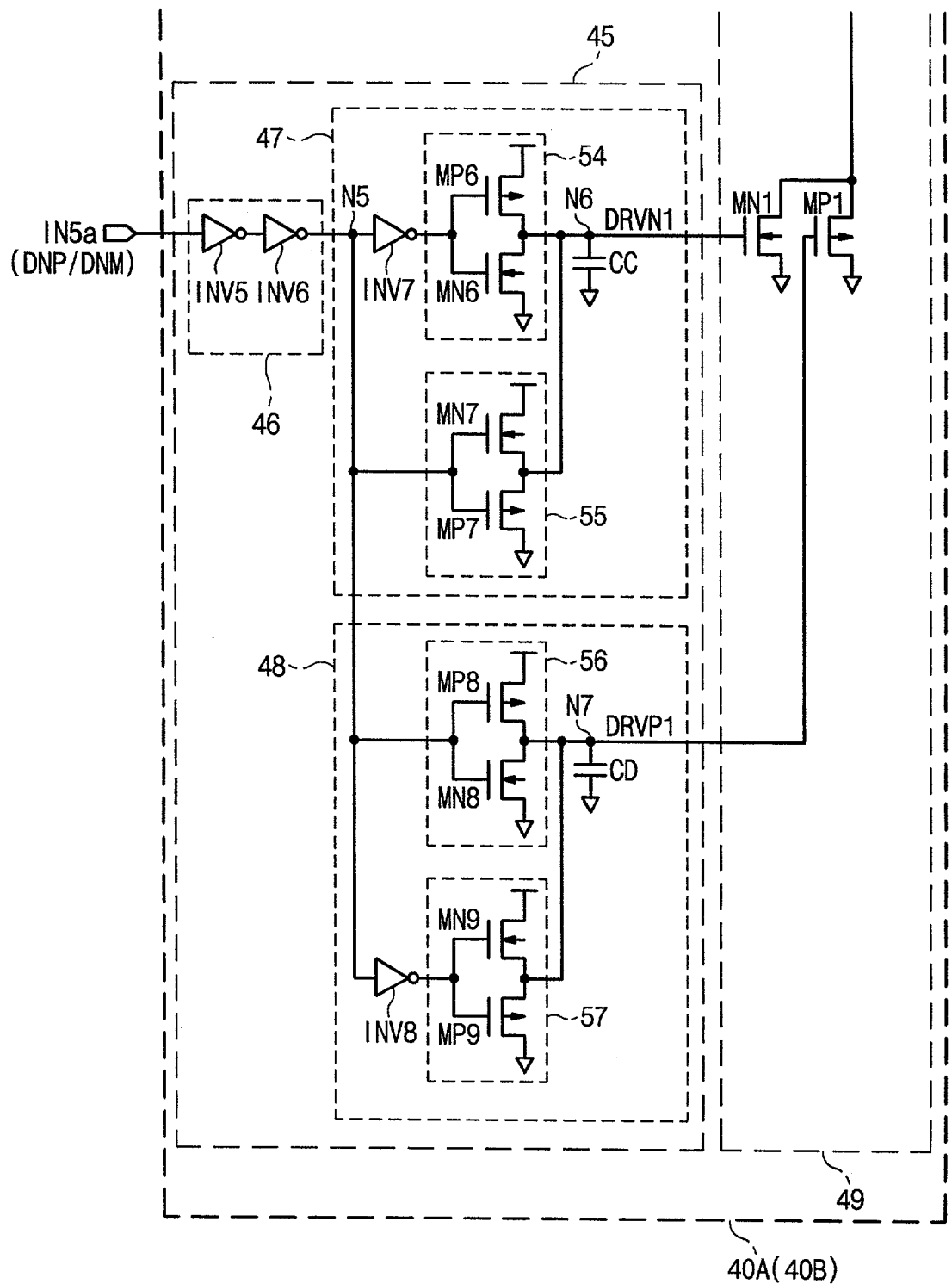
Figure 9:
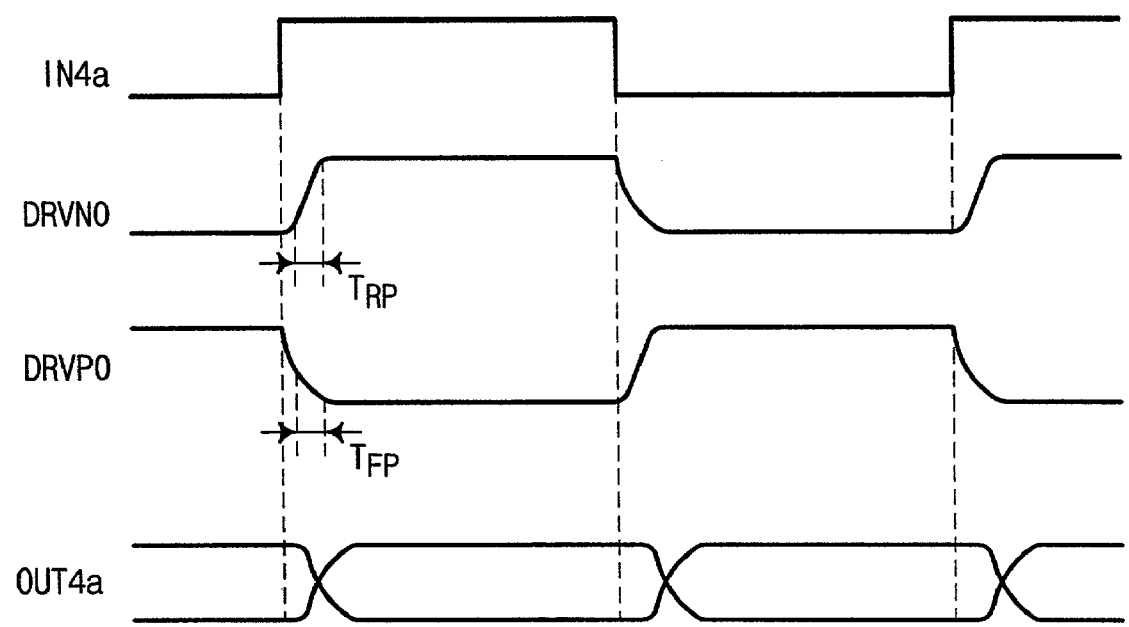
FIG. 9 is a timing diagram of signals conductive in the output buffer.

FIGS. 8 and 9 show a circuit configuration and signals of the output buffer. Referring to FIG. 8, the output buffer 40A (40B is the same as 40A) includes the first drive circuit 41, the second drive circuit 45, and an output circuit 49.

The first drive circuit 41 is composed of a delay circuit 42 connected between the output terminal IN4a and a node N2, a buffer circuit 43 connected between the node N2 and a node N3, a buffer circuit 44 connected between the node N2 and a node N4. The delay circuit 42 is formed of even-numbered inverters INV1 and INV2, and holds the first drive signal UPP (UPM in 40B) for a predetermined time.

The buffer circuit 43 is constructed of inverters INV3 and 50, a buffer 51, and a capacitor CA. The inverter INV3 reverses a logic state of a signal at the node N2. The inverter 50 is formed of a PMOS transistor MP2 and an NMOS transistor MN2, whose gates are coupled to an output of the inverter INV3 in common, serially connected between a power supply voltage and a ground voltage. The buffer 51 is formed of an NMOS transistor MN3 and a PMOS transistor MP3, whose gates are coupled to the node N2 in common, serially connected between the power supply voltage and the ground voltage. Output nodes of the inverter 50 and the buffer 51 are connected to the node N3 in common. The capacitor CA is coupled between the node N3 and the ground voltage.

The buffer circuit 44 is constructed of inverters 52 and INV4, a buffer 53, and a capacitor CB. The inverter 52 is formed of a PMOS transistor MP4 and an NMOS transistor MN4, whose gates are coupled to the node N2 in common, serially connected between the power supply voltage and the ground voltage. The inverter INV4 reverses a logic state of a signal at the node N2. The buffer 53 is formed of an NMOS transistor MN5 and a PMOS transistor MP5, whose gates are coupled to an output of the inverter INV4 in common, serially connected between the power supply voltage and the ground voltage. Output nodes of the inverter 52 and the buffer 53 are connected to the node N4 in common. The capacitor CB is coupled between the node N4 and the ground voltage.

The second drive circuit 45 is composed of a delay circuit 46 connected between the output terminal IN5a and a node N5, a buffer circuit 47 connected between the node N5 and a node N6, and a buffer circuit 48 connected between the node N5 and a node N7. The delay circuit 46 is formed of even-numbered inverters INV5 and INV6, and holds the second drive signal DNP (DNM in 40B) for a predetermined time.

The buffer circuit 47 is constructed of inverters INV7 and 54, a buffer 55, and a capacitor CC. The inverter INV7 reverses a logic state of a signal at the node N5. The inverter 54 is formed of a PMOS transistor MP6 and an NMOS transistor MN6, whose gates are coupled to an output of the inverter INV7 in common, serially connected between the power supply voltage and the ground voltage. The buffer 55 is formed of an NMOS transistor MN7 and a PMOS transistor MP7, whose gates are coupled to the node N5 in common, serially connected between the power supply voltage and the ground voltage. Output nodes of the inverter 54 and the buffer 55 are connected to the node N6 in common. The capacitor CC is coupled between the node N6 and the ground voltage.

The buffer circuit 48 is constructed of inverters 56 and INV8, a buffer 57, and a capacitor CD. The inverter 56 is formed of a PMOS transistor MP8 and an NMOS transistor MN8, whose gates are coupled to the node N5 in common, serially connected between the power supply voltage and the ground voltage. The inverter INV8 reverses a logic state of a signal at the node N5. The buffer 57 is formed of an NMOS transistor MN9 and a PMOS transistor MP9, whose gates are coupled to an output of the inverter INV8 in common, serially connected between the power supply voltage and the ground voltage. Output nodes of the inverter 56 and the buffer 57 are connected to the node N7 in common. The capacitor CD is coupled between the node N7 and the ground voltage.

The output circuit 49 is composed of NMOS transistors MN0 and MN1, PMOS transistors MP0 and MP1, and a capacitor CI. The NMOS and PMOS transistors, MN0 and MP0, whose gates are coupled to the nodes N3 and N4 respectively, are connected between the power supply voltage and the output terminal OUT4a in parallel. The NMOS and PMOS transistors, MN1 and MP1, whose gates are coupled to the nodes N6 and N7, respectively, are connected between the output terminal OUT4a and the ground voltage. The capacitor CI is connected between the output terminal OUT4a and the ground voltage.

When the drive signals UPP and DNP shown in FIG. 7 are applied to the input terminals IN4a and IN5a, respectively, the PMOS transistor MP1 is turned off before the NMOS transistor MN0 is turned on and the NMOS transistor MN1 is turned off before the PMOS transistor MP0 is turned on. Thus, a passing-through current flowing from the power supply voltage to the ground voltage is cut off to prevent unnecessary power consumption.

Referring to FIGS. 8 and 9, the output buffer 40A delays the drive signal UPP (UPM in 40B) for a predetermined time and then buffers the delayed drive signal UPP. During this operation, a rising time $T_{RP}$ of a signal DRVN0 at the node N3 gating the NMOS transistor MN0 is established with reference to drivability of the transistors MN2, MN3, MP2, and MP3, and capacitance of the capacitor CA. And, a falling time $T_{FP}$ of a signal DRVP0 at the node N4 gating the PMOS transistor MP0 is established with reference to drivability of the transistors MN4, MN5, MP4, and MP5, and capacitance of the capacitor CB. Therefore, rising and falling times of the bus-specific data signal DP (DN in 40B), $T_{RP}$ and $T_{FP}$, are dependently set by the drivability of the transistors MN2~MN9 and MP2~MP9, and the capacitance of the capacitors CA~CD.

Hence, the rising time $T_{RP}$ of the bus-specific data signal DP accords with the falling time $T_{FP}$ when the capacitance of CA is equal to that of CC and the capacitance of CB is equal to CD.

If voltage levels at the nodes N3 and N4 vary with different rates, undesirable results may occur in the crossover voltage Vcrs and the rising and falling times of the bus-specific data signal DP, $T_{RP}$ and $T_{FP}$, all those being defined in the USB standard V1.1. Such disaccorded variations at the nodes N3 and N4, arising from manufacturing parameters, are prevented by constructing the inverters as shown in FIG. 8, in which the inverters 50 and 51 forms a pair and the inverters 52 and 53 form a pair.

In the embodiments described herein, the transistors MP0, MP1, MN0, and MN1 are designed to drive a load capacitor $C_{LD}$ of 200~400 pF. An internal capacitor CI appearing at the output terminal OUT4a, at about tens of pF, is helpful to lessen the load capacitance of the bus-specific data signal (DP or DN).

The present invention provides a USB low-speed output driver operable reliably without being affected by various manufacturing parameters, while being applicable to the USB standard V1.1. Moreover, the bus-specific data signals DP and DN are conductive with operation characteristics, such as a crossover voltage and rising and falling slopes, also applicable to the USB standard V1.1.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A data transmission circuit for converting first and second data signals into third and fourth data signals, respectively, comprising:
   a first means for generating first and second drive signals by delaying an alternative one of rising and falling edges of a data input signal in response to plural control signals;
   a second means for generating the third data signal in response to the first and second drive signals;
   a third means for generating third and fourth drive signals by delaying an alternative one of rising and falling edges of the data input signal in response to the control signals; and
   a fourth means for generating the fourth data signal in response to the third and fourth drive signals;
   wherein the second and fourth means establish edge slopes of the third and fourth data signals.

2. The data transmission circuit of claim 1, wherein the control signals include an output enable signal, first and second delay-time selection signals, and first and second pulse-width control selection signals which select one of the rising and falling edges of the data input signal.

3. The data transmission circuit of claim 2, wherein the first means comprises:
   a first pulse-width control circuit for delaying an alternative one of the rising and falling edges of the data input signal in response to the first delay time selection signal and the first pulse-width control selection signal; and
   a first drive signal generator for creating the first and second drive signals in response to the output enable signal, the first drive signal being active when an output signal from the first pulse-width control circuit, the output enable signal, and the second drive signal are all activated, the second drive signal delayed by a predetermined time from the output signal of the first pulse-width control circuit.

4. The data transmission circuit of claim 3, wherein first pulse-width control circuit comprises:
   a first delay circuit for delaying the data input signal by a time in accordance with the first delay-time selection signal;
   an OR gate for conducting an OR operation on the data input signal and an output signal from the first delay circuit;
   an AND gate for conducting an AND operation on the data input signal and the output signal from the first delay circuit; and
   a selector for turning an alternative one of output signals from the OR and AND gates into the third data signal in response to the first pulse-width control selection signal.

5. The data transmission circuit of claim 3, wherein the first drive signal generator comprises:
   a NAND gate for conducting a NAND operation with the output enable signal, an output signal from the first pulse-width control circuit, and the second drive signal;
   a first reverse circuit for outputting the first drive signal that is inverted and delayed from an output signal of the NAND gate;
   an inverter for inverting the output enable signal;
   a NOR gate for conducting a NOR operation on an output of the inverter, the output signal from the first pulse-width control circuit, and the first drive signal; and
   a second reverse circuit for outputting the second drive signal that is inverted and delayed from an output of the NOR gate.

6. The data transmission circuit of claim 2, wherein the third means comprises:
   a second pulse-width control circuit for delaying an alternative one of the rising and falling edges of the data input signal in response to the first delay time selection signal and the second pulse-width control selection signal; and
   a second drive signal generator for creating the third and fourth drive signals in response to the output enable signal, the third drive signal being active when an output signal from the second pulse-width control circuit, the output enable signal, and the fourth drive signal are all activated, the fourth drive signal delayed by a predetermined time from the output signal of the second pulse-width control circuit.

7. The data transmission circuit of claim 6, wherein the second pulse-width control circuit comprises:
   an inverter for inverting the data input signal;
   a delay circuit for delaying an output signal of the inverter by a time in accordance with the second delay-time selection signal;
   an OR gate for conducting an OR operation on the data input signal and an output signal from the delay circuit;
   an AND gate for conducting an AND operation on the data input signal and the output signal from the delay circuit; and
   a selector for turning an alternative one of output signals from the OR and AND gates into the fourth data signal in response to the second pulse-width control selection signal.

8. The data transmission circuit of claim 6, wherein the second drive signal generator comprises:
   a NAND gate for conducting a NAND operation with the output enable signal, an output signal from the second pulse-width control circuit, and the fourth drive signal;
   a first reverse circuit for outputting the third drive signal that is inverted and delayed from an output signal of the NAND gate;
   an inverter for inverting the output enable signal;
   a NOR gate for conducting a NOR operation with an output of the inverter, the output signal from the second pulse-width control circuit, and the third drive signal; and
   a second reverse circuit for outputting the fourth drive signal that is inverted and delayed from an output of the NOR gate.

9. The data transmission circuit of claim 1, wherein the second means comprises:

a first delay circuit for delaying the first drive signal for a predetermined time;
a first circuit for receiving an output signal of the first delay circuit, having input and output terminals;
a second circuit for receiving an output signal of the first delay circuit, having input and output terminals;
a first transistor, of a first conductivity, connected between a power supply voltage and the first data line, a gate of the first transistor being coupled to the output terminal of the first circuit;
a second transistor, of a second conductivity, connected between the power supply voltage and the first data line, a gate of the second transistor being coupled to the output terminal of the second circuit;
a second delay circuit for delaying the second drive signal for a predetermined time;
a third circuit for receiving an output signal of the second delay circuit, having input and output terminals;
a fourth circuit for receiving an output signal of the second delay circuit, having input and output terminals;
a third transistor, of the first conductivity, connected between the first data line and a ground voltage, a gate of the third transistor being coupled to the output terminal of the third circuit;
a fourth transistor, of the second conductivity, connected between the first data line and the ground voltage, a gate of the fourth transistor being coupled to the output terminal of the fourth circuit; and
a capacitor coupled between the first data line and the ground voltage.

10. The data transmission circuit of claim 9, wherein the first circuit comprises:
a first inverter for inverting the output signal of the first delay circuit;
a second inverter for inverting an output signal of the first inverter;
a buffer for delaying the output signal of the first delay circuit; and
a capacitor coupled between the ground voltage and outputs of the second inverter and the buffer;
wherein the outputs of the second inverter and the buffer are connected to the output terminal of the first circuit.

11. The data transmission circuit of claim 9, wherein the second circuit comprises:
a first inverter for inverting the output signal of the first delay circuit;
a second inverter for inverting an output signal of the first inverter;
a buffer for delaying the output signal of the first delay circuit; and
a capacitor coupled between the ground voltage and outputs of the second inverter and the buffer;
wherein the outputs of the second inverter and the buffer are connected to the output terminal of the second circuit.

12. The data transmission circuit of claim 9, wherein the third circuit comprises:
a first inverter for inverting the output signal of the second delay circuit;
a second inverter for inverting an output signal of the first inverter;
a buffer for delaying the output signal of the second delay circuit; and
a capacitor coupled between the ground voltage and outputs of the second inverter and the buffer;
wherein the outputs of the second inverter and the buffer are connected to the output terminal of the third circuit.

13. The data transmission circuit of claim 9, wherein the fourth circuit comprises:
a first inverter for inverting the output signal of the second delay circuit;
a second inverter for inverting an output signal of the first inverter;
a buffer for delaying the output signal of the second delay circuit; and
a capacitor coupled between the ground voltage and outputs of the second inverter and the buffer;
wherein the outputs of the second inverter and the buffer are connected to the output terminal of the fourth circuit.

14. The data transmission circuit of claim 1, wherein the fourth means comprises:
a first delay circuit for delaying the third drive signal for a predetermined time;
a first circuit for receiving an output signal of the first delay circuit, having input and output terminals;
a second circuit for receiving an output signal of the first delay circuit, having input and output terminals;
a first transistor, of a first conductivity, connected between a power supply voltage and the second data line, a gate of the first transistor being coupled to the output terminal of the first circuit;
a second transistor, of a second conductivity, connected between the power supply voltage and the second data line, a gate of the second transistor being coupled to the output terminal of the second circuit;
a second delay circuit for delaying the fourth drive signal for a predetermined time;
a third circuit for receiving an output signal of the second delay circuit, having input and output terminals;
a fourth circuit for receiving an output signal of the second delay circuit, having input and output terminals;
a third transistor, of the first conductivity, connected between the second data line and a ground voltage, a gate of the third transistor being coupled to the output terminal of the third circuit;
a fourth transistor, of the second conductivity, connected between the second data line and the ground voltage, a gate of the fourth transistor being coupled to the output terminal of the fourth circuit; and
a capacitor coupled between the second data line and the ground voltage.

15. The data transmission circuit of claim 14, wherein the first circuit comprises:
a first inverter for inverting the output signal of the first delay circuit;
a second inverter for inverting an output signal of the first inverter;
a buffer for delaying the output signal of the first delay circuit; and
a capacitor coupled between the ground voltage and outputs of the second inverter and the buffer;
wherein the outputs of the second inverter and the buffer are connected to the output terminal of the first circuit.

16. The data transmission circuit of claim 14, wherein the second circuit comprises:
a first inverter for inverting the output signal of the first delay circuit;
a second inverter for inverting an output signal of the first inverter;
a buffer for delaying the output signal of the first delay circuit; and
a capacitor coupled between the ground voltage and outputs of the second inverter and the buffer;

wherein the outputs of the second inverter and the buffer are connected to the output terminal of the second circuit.

17. The data transmission circuit of claim 14, wherein the third circuit comprises:
   a first inverter for inverting the output signal of the second delay circuit;
   a second inverter for inverting an output signal of the first inverter;
   a buffer for delaying the output signal of the second delay circuit; and
   a capacitor coupled between the ground voltage and outputs of the second inverter and the buffer;
   wherein the outputs of the second inverter and the buffer are connected to the output terminal of the third circuit.

18. The data transmission circuit of claim 14, wherein the fourth circuit comprises:
   a first inverter for inverting the output signal of the second delay circuit;
   a second inverter for inverting an output signal of the first inverter;
   a buffer for delaying the output signal of the second delay circuit; and
   a capacitor coupled between the ground voltage and outputs of the second inverter and the buffer;
   wherein the outputs of the second inverter and the buffer are connected to the output terminal of the fourth circuit.

19. The data transmission circuit of claim 1, wherein the data lines are adaptable to a USB (universal serial bus) cable.

20. The data transmission circuit of claim 1, further comprising:
   a first load capacitor coupled between the first data line and a ground voltage; and
   a second load capacitor coupled between the second data line and the ground voltage.

* * * * *

UNITED STATES PATENT AND TRADEMARK OFFICE
CERTIFICATE OF CORRECTION

PATENT NO. : 7,005,891 B2  Page 1 of 1
DATED : February 28, 2006
INVENTOR(S) : Lee It is certified that error appears in the above-identified patent and that said Letters Patent is hereby corrected as shown below:

<u>Title page,</u>
Item [56], References Cited, FOREIGN PATENT DOCUMENTS, add
-- EP 0 942 562    9/1999 --.

Signed and Sealed this

Twenty-third Day of May, 2006

JON W. DUDAS
*Director of the United States Patent and Trademark Office*